(12) United States Patent
Syu et al.

(10) Patent No.: US 12,231,048 B2
(45) Date of Patent: Feb. 18, 2025

(54) APPARATUS AND METHOD FOR CONTROLLING TRANSIENT BOOST CIRCUIT OF VOLTAGE REGULATOR THROUGH FEEDBACK SIGNALS OBTAINED BY DIFFERENTIAL SENSING APPLIED TO OUTPUT CAPACITOR

(71) Applicant: MEDIATEK INC., Hsin-Chu (TW)

(72) Inventors: Jin-Yan Syu, Hsinchu (TW); Kuan-Yu Fang, Hsinchu (TW); Chih-Chen Li, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 282 days.

(21) Appl. No.: 17/987,811

(22) Filed: Nov. 15, 2022

(65) Prior Publication Data

US 2023/0223851 A1  Jul. 13, 2023

Related U.S. Application Data

(60) Provisional application No. 63/298,247, filed on Jan. 11, 2022.

(51) Int. Cl.
*H02M 3/158* (2006.01)
(52) U.S. Cl.
CPC ................. *H02M 3/1586* (2021.05)
(58) Field of Classification Search
CPC ... H02M 3/1586; H02M 3/1584; H02M 3/158
See application file for complete search history.

(56) References Cited

U.S. PATENT DOCUMENTS

| | | | |
|---|---|---|---|
| 5,889,392 A | 3/1999 | Moore | |
| 5,939,867 A | 8/1999 | Capici | |
| 6,157,176 A | 12/2000 | Pulvirenti | |
| 10,432,091 B2* | 10/2019 | Chen | H02M 3/158 |
| 2002/0070721 A1 | 6/2002 | Ostrom | |
| 2005/0168274 A1 | 8/2005 | Kimura | |
| 2008/0197823 A1 | 8/2008 | Crowther | |
| 2011/0291591 A1* | 12/2011 | Shiu | H05B 45/14 |
| | | | 315/297 |
| 2019/0131866 A1 | 5/2019 | Yan | |
| 2021/0313810 A1 | 10/2021 | Townsend | |

FOREIGN PATENT DOCUMENTS

| | | |
|---|---|---|
| CN | 107422774 B | 9/2018 |
| CN | 215010071 U | 12/2021 |
| EP | 3 176 593 A1 | 6/2017 |
| WO | 80/00900 A1 | 5/1980 |

* cited by examiner

*Primary Examiner* — Adolf D Berhane
*Assistant Examiner* — Afework S Demisse
(74) *Attorney, Agent, or Firm* — Winston Hsu (57) ABSTRACT

A transient boost controller for controlling a transient boost circuit of a voltage regulator includes a feedback circuit and a processing circuit. The feedback circuit obtains a first feedback signal and a second feedback signal sensed from an output capacitor of the voltage regulator, wherein the first feedback signal is derived from a voltage signal at a first plate of the output capacitor, and the second feedback signal is derived from a voltage signal at a second plate of the output capacitor. The processing circuit generates a detection result according to the first feedback signal and the second feedback signal, and outputs the detection result for controlling the transient boost circuit of the voltage regulator.

17 Claims, 4 Drawing Sheets

APPARATUS AND METHOD FOR CONTROLLING TRANSIENT BOOST CIRCUIT OF VOLTAGE REGULATOR THROUGH FEEDBACK SIGNALS OBTAINED BY DIFFERENTIAL SENSING APPLIED TO OUTPUT CAPACITOR

CROSS REFERENCE TO RELATED APPLICATIONS

This application claims the benefit of U.S. Provisional Application No. 63/298,247, filed on Jan. 11, 2022. The content of the application is incorporated herein by reference.

BACKGROUND

The present invention relates to a voltage regulator design, and more particularly, to an apparatus and method for controlling a transient boost circuit of a voltage regulator through feedback signals obtained by differential sensing applied to an output capacitor.

In an electronic device, a voltage regulator is used to supply stable power to electronic loads. The voltage regulator is typically designed to maintain an output voltage within specified limits. However, it is possible that the output voltage of the voltage regulator may change significantly when load transient happens. The ability of the voltage regulator to maintain a regulated output voltage in response to sudden changes in load current is called load transient response. Nowadays, there is a stringent requirement for load transient response. It is one of the most important parameters for voltage regulators. Thus, there is a need for an innovative transient boost design which is capable of improving the load transient response of the voltage regulator.

SUMMARY

One of the objectives of the claimed invention is to provide an apparatus and method for controlling a transient boost circuit of a voltage regulator through feedback signals obtained by differential sensing applied to an output capacitor.

According to a first aspect of the present invention, an exemplary transient boost controller for controlling a transient boost circuit of a voltage regulator is disclosed. The exemplary transient boost controller includes a feedback circuit and a processing circuit. The feedback circuit is arranged to obtain a first feedback signal and a second feedback signal sensed from an output capacitor of the voltage regulator, wherein the first feedback signal is derived from a voltage signal at a first plate of the output capacitor, and the second feedback signal is derived from a voltage signal at a second plate of the output capacitor. The processing circuit is arranged to generate a detection result according to the first feedback signal and the second feedback signal, and output the detection result for controlling the transient boost circuit of the voltage regulator.

According to a second aspect of the present invention, an exemplary method for controlling a transient boost circuit of a voltage regulator is disclosed. The exemplary method includes: obtaining a first feedback signal and a second feedback signal sensed from an output capacitor of the voltage regulator, wherein the first feedback signal is derived from a voltage signal at a first plate of the output capacitor, and the second feedback signal is derived from a voltage signal at a second plate of the output capacitor; and generating a detection result according to the first feedback signal and the second feedback signal, and outputting a detection result for controlling the transient boost circuit of the voltage regulator.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
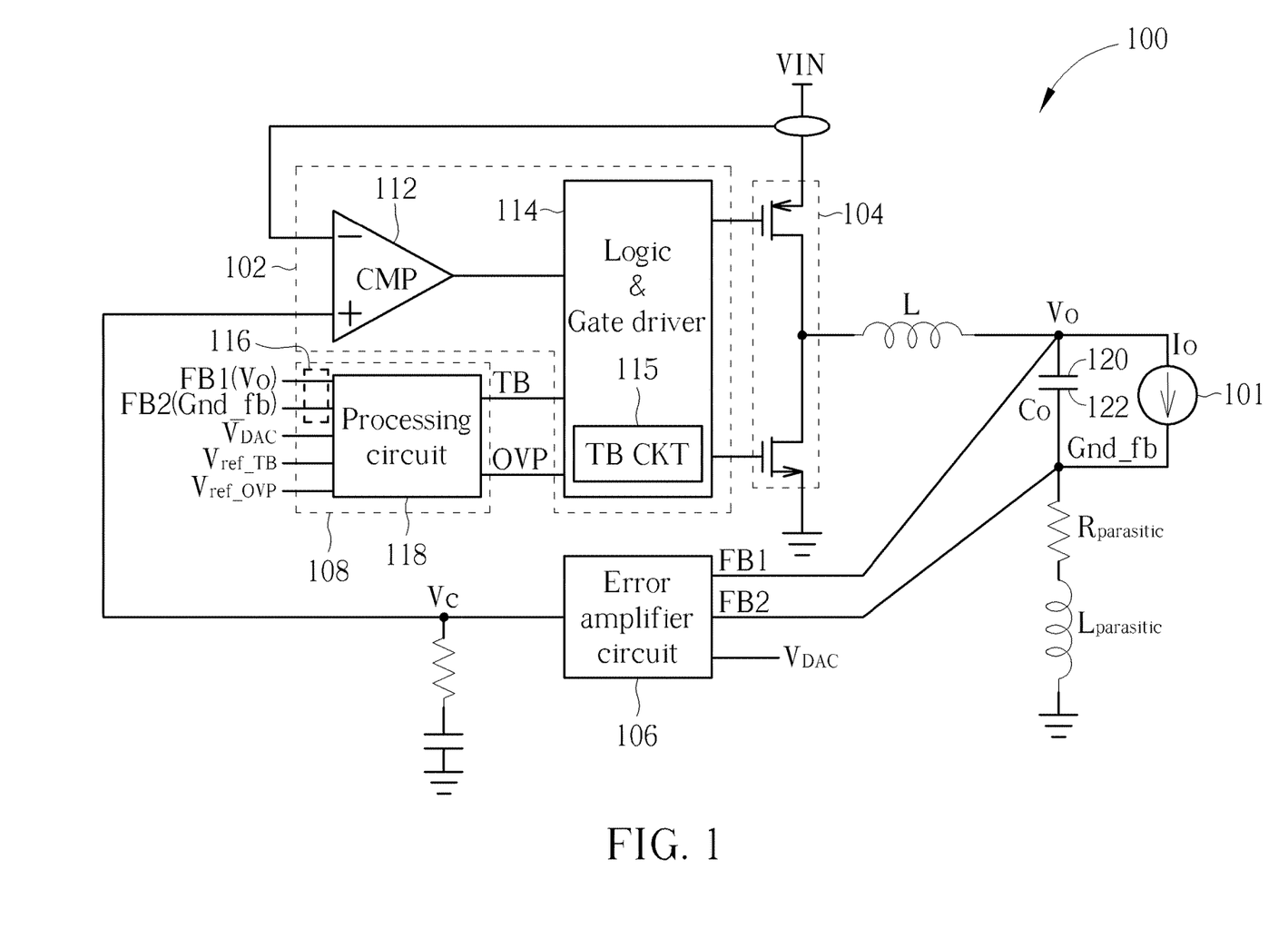
FIG. 1 is a diagram illustrating a first voltage regulator according to an embodiment of the present invention.

FIG. 1 is a diagram illustrating a first voltage regulator according to an embodiment of the present invention. The voltage regulator 100 may be a single-phase switching regulator that is capable of regulating the output voltage signal $V_o$ delivered to the load 101 according to an input voltage signal VIN. For example, the voltage regulator 100 may be a switching buck converter, the input voltage signal VIN may be a direct-current (DC) voltage signal provided from a battery device, the load 101 may be a central processing unit (CPU), and the output voltage signal $V_o$ may be a DC voltage signal provided to the CPU. It should be noted that the load current $I_o$ supplied to the load 101 may vary in response to different load conditions of the load 101. As shown in FIG. 1, the voltage regulator 100 may include a controller circuit 102, a power stage circuit 104, an inductor L, an output capacitor $C_o$, an error amplifier circuit 106, and a transient boost controller 108. The controller circuit 102 may include a comparator circuit (labeled by "CMP") 112 and a logic & gate driver block 114. The controller circuit 102 is a part of an output voltage feedback loop. In this embodiment, a control voltage signal $V_c$ fed into the comparator circuit 112 is output from the error amplifier circuit 106, and is indicative of an error between a regulated voltage and a reference voltage signal $V_{DAC}$ of the voltage regulator 100. In this embodiment, the error amplifier circuit 106 receives feedback signals FB1 and FB2, where the feedback signal FB1 is derived from a voltage signal $V_o$ at a first plate 120 of the output capacitor $C_o$, and the feedback signal FB2 is derived from a voltage signal Gnd_fb at a second plate 122 of the output capacitor $C_o$. Hence, the error amplifier circuit 106 generates the control voltage signal $V_c$ according to the difference between the reference voltage signal $V_{DAC}$ and the voltage across the output capacitor $C_o$ (e.g., FB1−FB2=Vo−Gnd_fb). However, this is for illustrative purposes only, and is not meant to be a limitation of the present invention.

The logic & gate driver block 114 includes circuits needed to deal with PWM control of the power stage circuit 104 and/or additional functions. For example, the logic & gate driver block 114 may further support over voltage protection, over current protection, etc. The logic & gate driver block 114 can regulate the output voltage signal $V_o$ delivered to the load 108 by controlling PWM pulses applied to the power stage circuit 104. For example, the power stage circuit 104 may include a high-side switch and a low-side switch controlled by PWM pulses generated from the logic & gate driver block 114. Generally speaking, when the reference voltage signal $V_{DAC}$ is set, the logic & gate driver block 114 controls the power stage circuit 104 in response to the control voltage signal $V_c$, thereby making a voltage level of the output voltage signal $V_o$ approach a voltage level of the reference voltage signal $V_{DAC}$.

In this embodiment, the voltage regulator 100 supports a transient boost function for improving the load transient response. For example, the logic & gate driver block 114 may include a transient boost circuit (labeled by "TB CKT") 115, and the transient boost controller 108 is arranged to generate and output a detection result TB/OVP for controlling (e.g., enabling/disabling) the transient boost circuit 115 of the voltage regulator 100. If the output voltage signal $V_o$ suffers from a sudden load increase, the transient boost controller 108 may set the detection result TB to trigger the transient boost circuit 115 for causing the output voltage signal $V_o$ to rise and bringing the output voltage signal $V_o$ back into regulation. If the output voltage signal $V_o$ suffers from a sudden load decrease, the transient boost controller 108 may set the detection result OVP to trigger the transient boost circuit 115 for causing the output voltage signal $V_o$ to fall and bringing the output voltage signal $V_o$ back into regulation. Since the present invention is focused on the transient boost controller design (e.g., transient boost enabling/disabling mechanism), further description of the transient boost circuit 115 used for bringing the output voltage signal $V_o$ back to regulation when a sudden load change occurs is omitted here for brevity.

As shown in FIG. 1, the proposed transient boost controller 108 includes a feedback circuit 116 and a processing circuit 118. The feedback circuit 116 may be implemented by two feedback paths coupled to the first plate 120 and the second plate 122 of the output capacitor $C_o$, respectively. Specifically, the feedback circuit 116 applies differential sensing of the output capacitor $C_o$. Like the error amplifier circuit 106, the feedback circuit 116 obtains the feedback signal FB1 (e.g., FB1=$V_o$) and the feedback signal FB2 (e.g., FB2=Gnd_fb) sensed from the output capacitor $C_o$ of the voltage regulator 100.

The processing circuit 118 is arranged to generate a detection result TB/OVP according to the feedback signals FB1 and FB2, and output the detection result TB/OVP for controlling the transient boost circuit 115 of the voltage regulator 100. For example, the processing circuit 118 may jointly consider the feedback signals FB1 and FB2 to generate and output the detection result TB/OVP. The detection result TB is asserted when a sudden load increase (i.e., sudden decrease of the output voltage signal $V_o$) is detected by the transient boost controller 108. The detection result OVP is asserted when a sudden load decrease (i.e., sudden increase of the output voltage signal $V_o$) is detected by the transient boost controller 108.

In some embodiments of the present invention, the processing circuit 118 is further arranged to generate a time derivative $dV_o$ of the feedback signal FB1 (FB1=$V_o$) and a time derivative dGnd_fb of the feedback signal FB2 (FB2=Gnd_fb); and the detection result TB/OVP is generated based at least partly on the time derivative $dV_o$ of the feedback signal FB1 and the time derivative dGnd_fb of the second feedback signal FB2.

In some embodiments of the present invention, the processing circuit 118 is further arranged to receive the reference voltage signal $V_{DAC}$ and at least one offset voltage signal $V_{ref\_TB}$, $V_{ref\_OVP}$. For example, the processing circuit 118 may receive a single offset voltage signal VOS, where VOS=$V_{ref\_VB}$=$V_{ref\_OVP}$. For another example, the processing circuit 118 may receive two offset voltage signals $V_{ref\_TB}$ and $V_{ref\_OVP}$, where $V_{ref\_VB} \neq V_{ref\_OVP}$. In addition, the detection result TB/OVP is generated according to the reference voltage signal $V_{DAC}$, the at least one offset voltage signal $V_{ref\_TB}$, $V_{ref\_OVP}$, the feedback signal FB1 (FB1=$V_o$), the feedback signal FB2 (FB2=Gnd_fb) the time derivative $dV_o$ of the feedback signal FB1 (FB1=$V_o$), and the time derivative dGnd_fb of the feedback signal FB2 (FB2=Gnd_fb).

Figure 2:
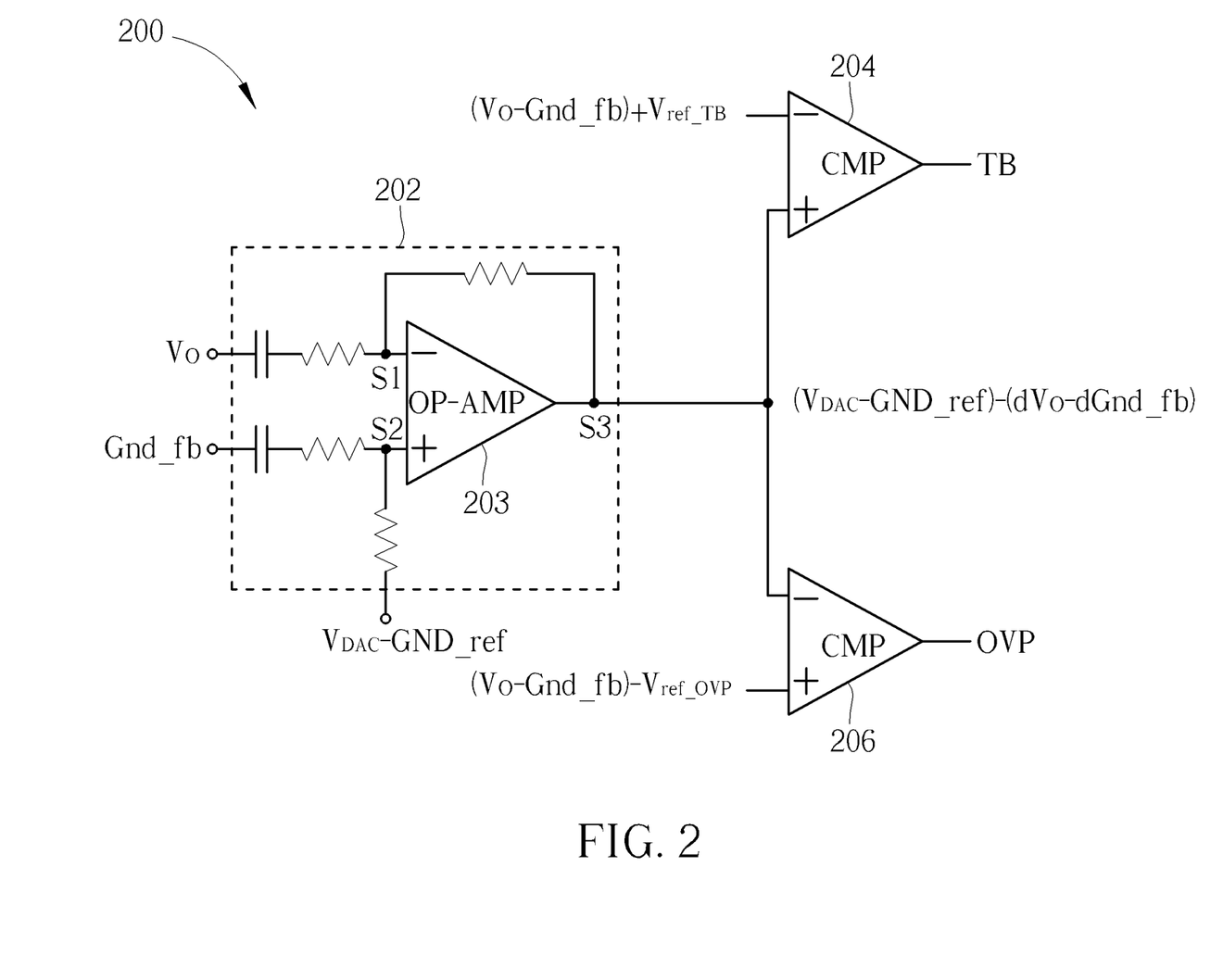
FIG. 2 is a diagram illustrating a first circuit design of a processing circuit in a transient boost controller according to an embodiment of the present invention.

FIG. 2 is a diagram illustrating a first circuit design of a processing circuit in a transient boost controller according to an embodiment of the present invention. For example, the processing circuit 118 shown in FIG. 1 may be implemented by the processing circuit 200 shown in FIG. 2. The processing circuit 200 includes a differentiator amplifier circuit 202 and a plurality of comparator circuits (labeled by "CMP") 204 and 206. The differentiator amplifier circuit 202 is implemented by an operational amplifier (labeled by "OP-AMP") 203, and the operational amplifier circuit performs the mathematical operation of differentiation, that is, it produces a voltage output which is directly proportional to the input voltage's rate-of-change with respect to time. In this embodiment, the differentiator amplifier circuit 202 is arranged to generate an amplifier output signal S3 according to at least the feedback signal FB1 (FB1=$V_o$), the feedback signal FB2 (FB2=Gnd_fb), and the reference voltage signal $V_{DAC}$, wherein the amplifier output signal S3 depends on at least the reference voltage signal $V_{DAC}$, the time derivative $dV_o$ of the feedback signal FB1 (FB1=$V_o$), and the time derivative dGnd_fb of the feedback signal FB2 (FB2=Gnd_fb). Specifically, the differentiator amplifier circuit 202 has an inverting input node (−), a non-inverting input node (+), and an output node, wherein the inverting input node (−) of the operational amplifier 203 is arranged to receive an amplifier input signal S1 derived from the feedback signal FB1 (FB1=$V_o$), the non-inverting input node (+) of the operational amplifier 203 is arranged to receive an amplifier input signal S2 derived from the feedback signal FB2 (FB2=Gnd_fb), the reference voltage signal $V_{DAC}$ and a reference ground signal GND_ref, and the output node of the operational amplifier 203 is arranged to output the amplifier output signal S3. The reference ground signal GND_ref may be a common ground of the voltage regulator 100. Ideally, the reference ground signal GND_ref is equal to 0V. Due to inherent characteristics of the differentiator amplifier circuit 202, the amplifier output signal S3 is equal to ($V_{DAC}$−GND_ref)−($dV_o$−dGnd_fb).

The comparator circuit 204 is arranged to generate a detection result TB according to the feedback signal FB1 (FB1=$V_o$), the feedback signal FB2 (FB2=GND_ref), the offset voltage signal $V_{ref\_TB}$, and the amplifier output signal S3 (S3=($V_{DAC}$−GND_ref)−(d$V_o$−dGnd_fb)). The offset voltage signal $V_{ref\_TB}$ defines an offset voltage threshold for triggering a level transition of the detection result TB. Specifically, the comparator circuit 204 has an inverting input node (−), a non-inverting input node (+), and an output node, where the inverting input node (−) is arranged to receive ($V_o$−Gnd_fb)+$V_{ref\_TB}$, the non-inverting input node (+) is arranged to receive the amplifier output signal S3 (S3=($V_{DAC}$−GND_ref)−(d$V_o$−dGnd_fb)), and the output node is arranged to output the detection result TB. When the difference ($V_o$−Gnd_fb) between the feedback signals FB1 and FB2 falls to a level lower than ($V_{DAC}$−GND_ref)−(d$V_o$−dGnd_fb)−$V_{ref\_TB}$, the comparator circuit 204 sets the detection result TB by a logic high level to indicate occurrence of a sudden load increase (i.e., sudden decrease of the output voltage signal $V_o$). Hence, in response to the logic high level of the detection result TB (i.e., TB=1), the transient boost circuit 115 is enabled for causing the output voltage signal $V_o$ to rise and bringing the output voltage signal $V_o$ back into regulation. When the difference ($V_o$−Gnd_fb) between the feedback signals FB1 and FB2 no longer falls to a level lower than ($V_{DAC}$−GND_ref)−(d$V_o$−dGnd_fb)−$V_{ref\_TB}$, the comparator circuit 204 sets the detection result TB by a logic low level. Hence, in response to the logic low level of the detection result TB (i.e., TB=0), the transient boost circuit 115 is disabled and does not cause the output voltage signal $V_o$ to rise.

The comparator circuit 206 is arranged to generate a detection result OVP according to the feedback signal FB1 (FB1=$V_o$), the feedback signal FB2 (FB2=GND_ref), the offset voltage signal $V_{ref\_OVP}$, and the amplifier output signal S3 (S3=($V_{DAC}$−GND_ref)−(d$V_o$−dGnd_fb)). The offset voltage signal $V_{ref\_OVP}$ defines an offset voltage threshold for triggering a level transition of the detection result OVP, and may be equal to or different from the offset voltage signal $V_{ref\_TB}$, depending upon actual design considerations. Specifically, the comparator circuit 206 has an inverting input node (−), a non-inverting input node (+), and an output node, the non-inverting input node (+) is arranged to receive ($V_o$−Gnd_fb)−$V_{ref\_OVP}$, the inverting input node (−) is arranged to receive the amplifier output signal S3 (S3=$W_{DAC}$−GND_ref)−(d$V_o$− dGnd_fb)) and the output node is arranged to output the detection result OVP. When the difference ($V_o$−Gnd_fb) between the feedback signals FB1 and FB2 rises to a level higher than ($V_{DAC}$−GND_ref)−(d$V_o$−dGnd_fb)+$V_{ref\_OVP}$, the comparator circuit 206 sets the detection result OVP by a logic high level to indicate occurrence of a sudden load decrease (i.e., sudden increase of the output voltage signal $V_o$). Hence, in response to the logic high level of the detection result OVP (i.e., OVP=1), the transient boost circuit 115 is enabled for causing the output voltage signal $V_o$ to fall and bringing the output voltage signal $V_o$ back into regulation. When the difference ($V_o$−Gnd_fb) between the feedback signals FB1 and FB2 no longer rises to a level higher than ($V_{DAC}$−GND_ref)−(d$V_o$−dGnd_fb)+$V_{ref\_OVP}$, the comparator circuit 206 sets the detection result OVP by a logic low level. Hence, in response to the logic low level of the detection result OVP (i.e., OVP=0), the transient boost circuit 115 is disabled and does not cause the output voltage signal $V_o$ to fall.

Since the feedback circuit 116 provides two feedback signals FB1 and FB2 through differential sensing of the output capacitor $C_o$, the voltages $V_o$ and Gnd_fb at opposite plates 120 and 122 of the output capacitor $C_o$ are both fed back and input to the differential amplifier 202. As shown in FIG. 1, the voltage Gnd_fb at the plate 122 of the output capacitor $C_o$ may suffer from ground noise due to parasitic effects (e.g., parasitic series resistance $R_{parasitic}$ and parasitic series inductance $L_{parasitic}$) of the grounding paths, and the ground noise may be coupled to the voltage $V_o$ through the output capacitor $C_o$. Consider a case where only the output voltage signal $V_o$ is sensed and fed back to a differentiator amplifier circuit for detection of the sudden load change (i.e., sudden change of the output voltage signal $V_o$), the transient boost circuit 115 may be mistriggered by the time derivative of the output voltage signal $V_o$ that is interfered with the ground noise. To address this issue, the present invention proposes jointly considering the voltages $V_o$ and Gnd_fb fed back through differential sensing of the output capacitor $C_o$. As shown in FIG. 2, the amplifier output signal S3 generated from the differentiator amplifier circuit 202 benefits from noise cancellation resulting from the differential signal sensing of $V_o$ and Gnd_fb that are received by inverting node (−) and non-inverting node (+) of the operational amplifier 203. Specifically, the term (d$V_o$−dGnd_fb) generated from the differentiator amplifier circuit 202 is not interfered with the ground noise. The differentiator amplifier circuit 202 is capable of detecting the regulated voltage's rate-of-change with respect to time. When a sudden load increase (i.e., sudden decrease of the output voltage signal $V_o$) has a high rate of change, the term (d$V_o$−dGnd_fb) generated from the differentiator amplifier circuit 202 is a large value, which makes the detection result TB has a level transition from a logic low level (i.e., 0) to a high logic level (i.e., 1) before the difference ($V_o$−Gnd_fb) between the feedback signals FB1 and FB2 actually falls to a level lower than ($V_{DAC}$−GND_ref)−$V_{ref\_TB}$. In this way, the transient boost circuit 115 can be triggered earlier for causing the output voltage signal $V_o$ to rise and bringing the output voltage signal $V_o$ back to regulation, which improves the load transient response of the voltage regulator 100. Similarly, when a sudden load decrease (i.e., sudden increase of the output voltage signal $V_o$) has a high rate of change, the term (d$V_o$−dGnd_fb) generated from the differentiator amplifier circuit 202 has a large value, which makes the detection result OVP has a level transition from a logic low level (i.e., 0) to a high logic level (i.e., 1) before the difference ($V_o$−Gnd_fb) between the feedback signals FB1 and FB2 actually rises to a level higher than ($V_{DAC}$−GND_ref)+$V_{ref\_OVP}$ In this way, the transient boost circuit 115 can be triggered earlier for causing the output voltage signal $V_o$ to fall and bringing the output voltage signal $V_o$ back to regulation, which improves the load transient response of the voltage regulator 100.

The operable range of the main loop of the voltage regulator 100 is located at the low band, and the operable range of the differentiator amplifier circuit is located at the high band. To improve the mid-band transient response performance, the DC references ($V_{DAC}$−GND_ref)−$V_{ref\_TB}$ and ($V_{DAC}$−GND_ref)+$V_{ref\_OVP}$ are further used by comparator circuits 204 and 206 for detection of the sudden load change (i.e., sudden change of the output voltage signal $V_o$). Hence, when a sudden load change (i.e., sudden change of the output voltage signal $V_o$) has a high rate of change, the detection result TB/OVP can be asserted by a large (d$V_o$−dGnd_fb) generated from the differentiator amplifier circuit 202; and when a sudden load change (i.e., sudden change of the output voltage signal $V_o$) has a mid or low rate of change, the detection result TB/OVP can be asserted by voltage comparison that is based on the DC reference $(V_{DAC}-GND\_ref)-V_{ref\_TB}/(V_{DAC}-GND\_ref)+V_{ref\_OVP}$.

The setting of the detection result TB may be expressed using the following formula.

$$TB=[(V_o-Gnd\_fb)+V_{ref\_TB}]-[(V_{DAC}-GND\_ref)-(dV_o-dGnd\_fb)]=(V_oV_{DAC})+(GND\_ref-Gnd\_fb)+(dV_o-dGnd\_fb)+(V_{ref\_TB}-GND\_ref) \quad (1)$$

The setting of the detection result OVP may be expressed using the following formula.

$$OVP=[(V_o-Gnd\_fb)-V_{ref\_OVP}]-[(V_{DAC}-GND\_ref)-(dV_o-dGnd\_fb)]=(V_o-V_{DAC})+(GND\_ref-Gnd\_fb)+(dV_o-dGnd\_fb)+(GND_{ref}V_{ref\_OVP}) \quad (2)$$

Figure 3:
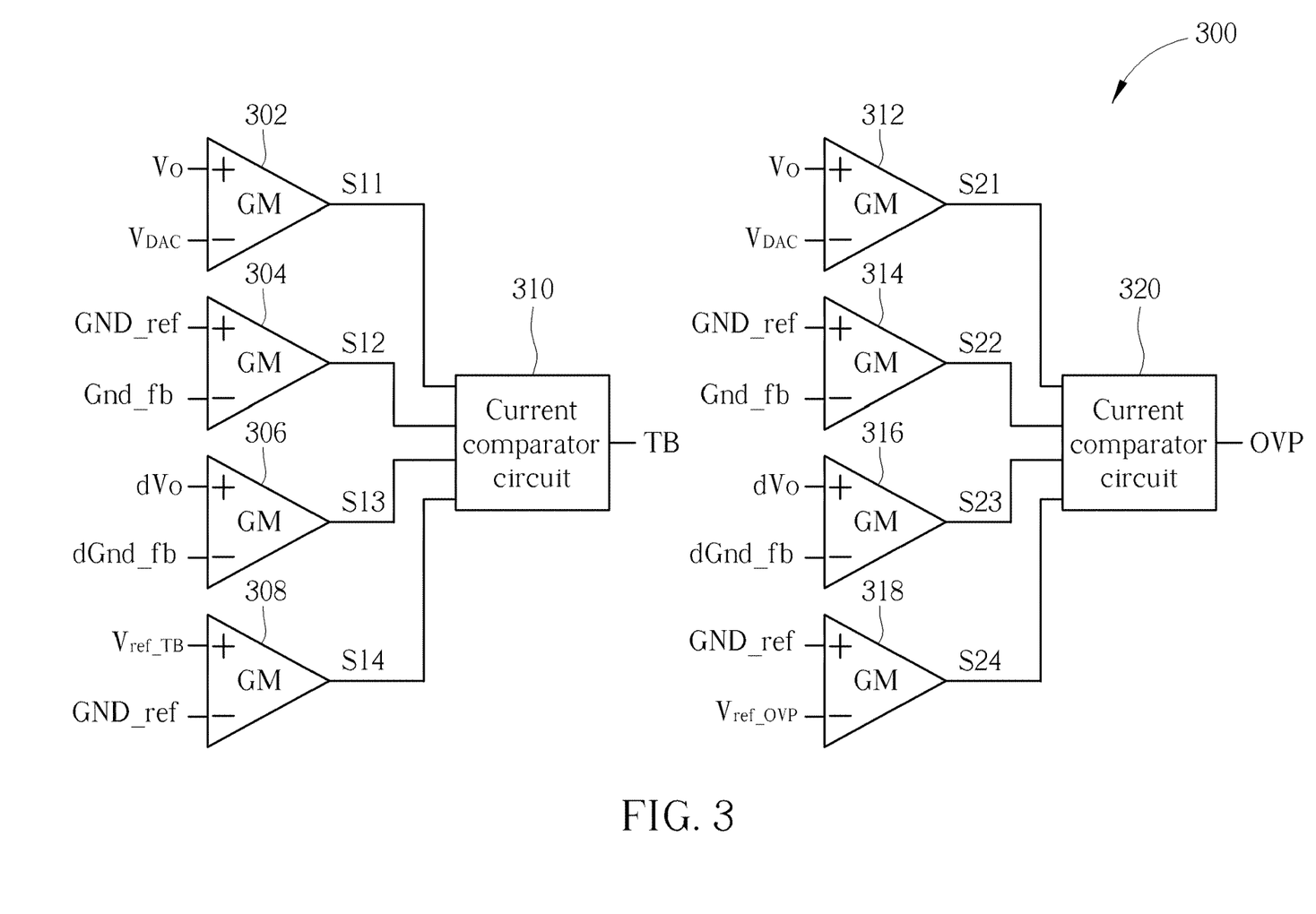
FIG. 3 is a diagram illustrating a second circuit design of a processing circuit in a transient boost controller according to an embodiment of the present invention.

Based on above formulas (1) and (2), the transient boost controller may be easily implemented by using parallel processing hardware architecture. FIG. 3 is a diagram illustrating a second circuit design of a processing circuit design in a transient boost controller according to an embodiment of the present invention. For example, the processing circuit 118 shown in FIG. 1 may be implemented by the processing circuit 300 shown in FIG. 3. The processing circuit 300 includes a plurality of transconductance amplifier circuits (labeled by "GM") 302, 304, 306, 308, 312, 314, 316, 318 and a plurality of current comparator circuits 310, 320.

The transconductance amplifier circuits 302, 304, 306, 308 are arranged to generate a plurality of amplifier output signals (which are current-mode signals) S11, S12, S13, S14 according to voltage-mode amplifier input signals, including the reference voltage signal $V_{DAC}$, the offset voltage signal $V_{ref\_TB}$, the feedback signal FB1 (FB1=$V_o$), the feedback signal FB2 (FB2=Gnd_fb), the time derivative $dV_o$ of the feedback signal FB1 (FB1=$V_o$), and the time derivative dGnd_fb of the feedback signal FB2 (FB2=Gnd_fb). Specifically, the transconductance amplifier circuit 302 has a non-inverting input node (+) for receiving the feedback signal FB1 (FB1=$V_o$) and an inverting input node (−) for receiving the reference voltage signal $V_{DAC}$, the transconductance amplifier circuit 304 has a non-inverting input node (+) for receiving the reference ground signal GND_ref and an inverting input node (−) for receiving the feedback signal Gnd_fb, the transconductance amplifier circuit 306 has a non-inverting input node (+) for receiving the time derivative $dV_o$ of the feedback signal FB1 (FB1=$V_o$) and an inverting input node (−) for receiving the time derivative dGnd_fb of the feedback signal FB2 (FB2=Gnd_fb), and the transconductance amplifier circuit 308 has a non-inverting input node (+) for receiving the offset voltage signal $V_{ref\_TB}$ and an inverting input node (−) for receiving the reference ground signal GND_ref. The current comparator circuit 310 is arranged to receive the amplifier output signals S11, S12, S13, S14, and output the detection result (which is a voltage-mode signal) TB according to the amplifier output signals S11, S12, S13, S14.

The transconductance amplifier circuits 312, 314, 316, 318 are arranged to generate a plurality of amplifier output signals (which are current-mode signals) S21, S22, S23, S24 according to voltage-mode amplifier input signals, including the reference voltage signal $V_{DAC}$, the offset voltage signal $V_{ref\_OVP}$, the feedback signal FB1 (FB1=$V_o$), the feedback signal FB2 (FB2=Gnd_fb), the time derivative $dV_o$ of the feedback signal FB1 (FB1=$V_o$), and the time derivative dGnd_fb of the feedback signal FB2 (FB2=Gnd_fb). Specifically, the transconductance amplifier circuit 312 has a non-inverting input node (+) for receiving the feedback signal FB1 (FB1=$V_o$) and an inverting input node (−) for receiving the reference voltage signal $V_{DAC}$, the transconductance amplifier circuit 314 has a non-inverting input node (+) for receiving the reference ground signal GND_ref and an inverting input node (−) for receiving the feedback signal Gnd_fb, the transconductance amplifier circuit 316 has a non-inverting input node (+) for receiving the time derivative $dV_o$ of the feedback signal FB1 (FB1=$V_o$) and an inverting input node (−) for receiving the time derivative dGnd_fb of the feedback signal FB2 (FB2=Gnd_fb), and the transconductance amplifier circuit 318 has a non-inverting input node (+) for receiving the reference ground signal GND_ref and an inverting input node (−) for receiving the offset voltage signal $V_{ref\_TB}$. The current comparator circuit 320 is arranged to receive the amplifier output signals S21, S22, S23, S24, and output the detection result (which is a voltage-mode signal) OVP according to the amplifier output signals S21, S22, S23, S24.

Figure 4:
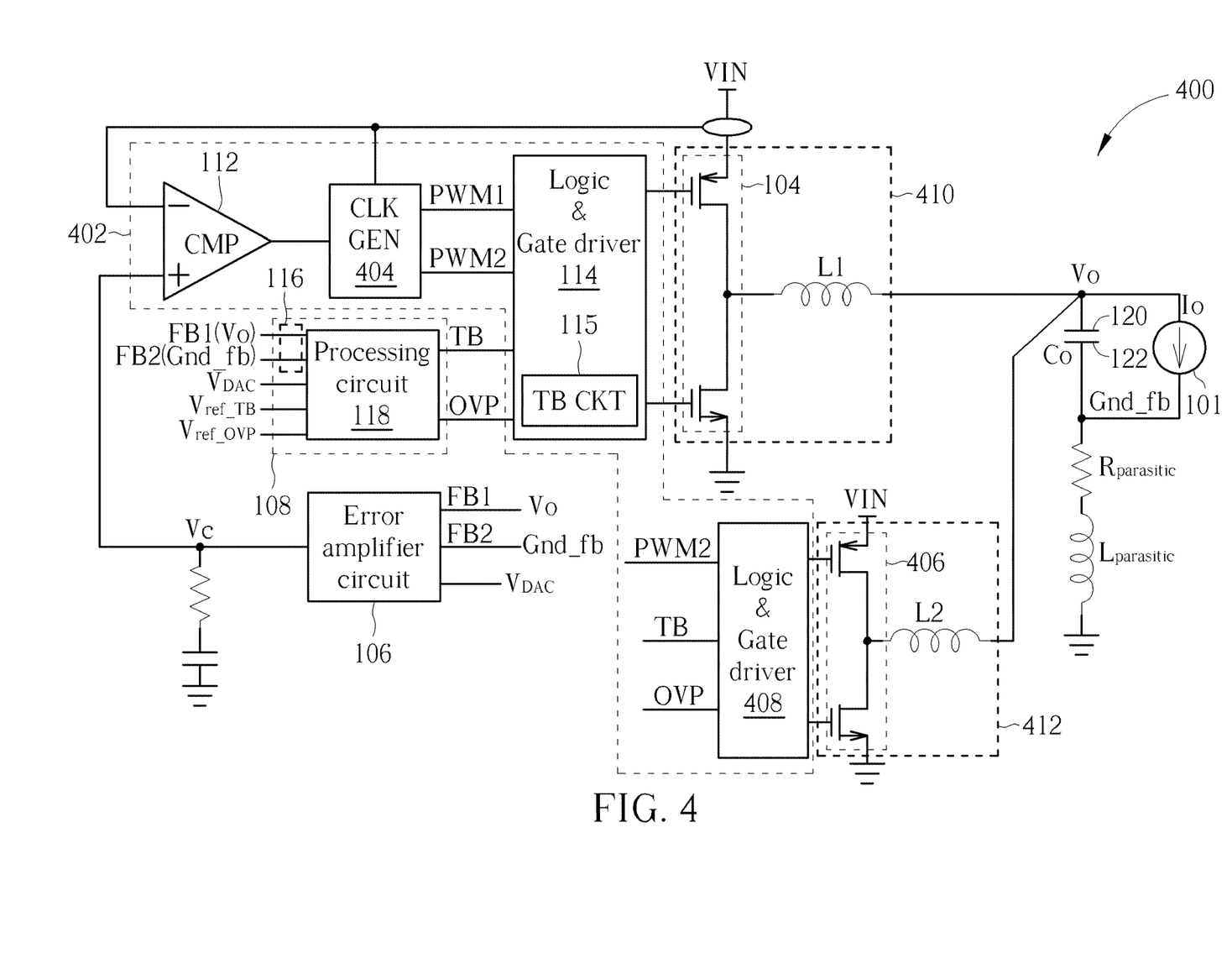
FIG. 4 is a diagram illustrating a second voltage regulator according to an embodiment of the present invention.

The transient boost technique may also be employed by a voltage regulator being a multi-phase switching regulator (e.g., multi-phase buck converter), where the detection result TB/OVP generated from the proposed transient boost controller can be further used for controlling (e.g., enabling/disabling) at least one slave phase. FIG. 4 is a diagram illustrating a second voltage regulator according to an embodiment of the present invention. For brevity and simplicity, it is assumed that the voltage regulator 400 may be a 2-phase buck converter with a master phase 410 and a slave phase 412. However, this is for illustrative purposes only, and is not meant to be a limitation of the present invention. In an alternative design, the proposed transient boost controller may be employed by a multi-phase switching regulator with a master phase and more than one slave phase.

The voltage regulator 400 is capable of regulating the output voltage signal $V_o$ delivered to the load 101 according to the input voltage signal VIN. For example, the input voltage signal VIN may be a DC voltage signal provided from a battery device, the load 101 may be a CPU, and the output voltage signal $V_o$ may be a DC voltage signal provided to the CPU. It should be noted that the load current $I_o$ supplied to the load 101 may vary in response to different load conditions of the load 101. As shown in FIG. 4, the voltage regulator 400 may include a controller circuit 402, a master phase 410 (which includes a power stage circuit 104 and an inductor $L_1$), a slave phase 412 (which includes a power stage circuit 406 and an inductor $L_2$), an output capacitor $C_o$, an error amplifier circuit 106, and a transient boost controller 108. The controller circuit 402 may include a comparator circuit (labeled by "CMP") 112, a clock generator circuit (labeled by "CLK GEN") 404, a logic & gate driver block 114 for the master phase 410, and a logic & gate driver block 408 for the slave phase 410. The clock generator circuit 404 generates and outputs one pulse-width modulation (PWM) control signal PWM1 to the logic & gate driver block 114, and generates and outputs another PWM control signal PWM2 to the logic & gate driver block 408.

The logic & gate driver block 114 is arranged to deal with PWM control of the power stage circuit 104 belonging to the master phase 410. Hence, the logic & gate driver block 114 can regulate the output voltage signal $V_o$ delivered to the load 108 by controlling PWM pulses applied to the power stage circuit 104. The logic & gate driver block 408 is arranged to deal with PWM control of the power stage circuit 406 belonging to the slave phase 412. Hence, the logic & gate driver block 408 can regulate the output voltage signal $V_o$ delivered to the load 108 by controlling PWM pulses applied to the power stage circuit 406. In this embodiment, the transient boost controller 108 further outputs the detection result TB/OVP to the logic & gate driver block 408.

As mentioned above, when the processing circuit 118/200/300 sets the detection result TB by a logic high level (i.e., TB=1), the transient boost circuit 115 can be enabled for causing the output voltage signal $V_o$ to rise and bringing the output voltage signal $V_o$ back into regulation; and when the processing circuit 118/200/300 sets the detection result OVP by a logic high level (i.e., OVP=1), the transient boost circuit 115 can be enabled for causing the output voltage signal $V_o$ to fall and bringing the output voltage signal $V_o$ back into regulation. Regarding the voltage regulator 400 shown in FIG. 4, when the processing circuit 118/200/300 sets the detection result TB by a logic high level (i.e., TB=1), the logic & gate driver block 408 may enable the slave phase 412 for increasing the load current $I_o$ supplied to the load 101; and when the processing circuit 118/200/300 sets the detection result OVP by a logic high level (i.e., OVP=1), the logic & gate driver block 408 may disable the slave phase 412 for decreasing the load current $I_o$ supplied to the load 101. In other words, the transient boost controller 108 generates and outputs the detection result TB/OVP for controlling (e.g., enabling/disabling) the transient boost circuit 115 of the voltage regulator 400, and further outputs the detection result TB/OVP for controlling (e.g., enabling/disabling) the slave phase 412 of the voltage regulator 400.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transient boost controller for controlling a transient boost circuit of a voltage regulator, comprising:
    a feedback circuit, arranged to obtain a first feedback signal and a second feedback signal sensed from an output capacitor of the voltage regulator, wherein the first feedback signal is derived from a voltage signal at a first plate of the output capacitor, and the second feedback signal is derived from a voltage signal at a second plate of the output capacitor; and
    a processing circuit, arranged to generate a detection result according to the first feedback signal and the second feedback signal, and output the detection result for controlling the transient boost circuit of the voltage regulator.

2. The transient boost controller of claim 1, wherein the processing circuit is further arranged to generate a time derivative of the first feedback signal and a time derivative of the second feedback signal; and the detection result is generated based at least partly on the time derivative of the first feedback signal and the time derivative of the second feedback signal.

3. The transient boost controller of claim 2, wherein the processing circuit is further arranged to receive a reference voltage signal and at least one offset voltage signal; and the detection result is generated according to at least the reference voltage signal, the at least one offset voltage signal, the first feedback signal, the second feedback signal, the time derivative of the first feedback signal, and the time derivative of the second feedback signal.

4. The transient boost controller of claim 3, wherein the processing circuit comprises:
    a differentiator amplifier circuit, arranged to generate an amplifier output signal according to at least the first feedback signal, the second feedback signal, and the reference voltage signal, wherein the amplifier output signal depends on at least the reference voltage signal, the time derivative of the first feedback signal, and the time derivative of the second feedback signal; and
    a comparator circuit, arranged to generate the detection result according to the first feedback signal, the second feedback signal, the at least one offset voltage signal, and the amplifier output signal.

5. The transient boost controller of claim 4, wherein the differentiator amplifier circuit has an inverting input node, a non-inverting input node, and an output node, the inverting input node is arranged to receive a first amplifier input signal derived from the first feedback signal, the non-inverting input node is arranged to receive a second amplifier input signal derived from the second feedback signal, the reference voltage signal and a reference ground signal, and the output node is arranged to output the amplifier output signal.

6. The transient boost controller of claim 4, wherein the comparator circuit has an inverting input node, a non-inverting input node, and an output node; the inverting input node is arranged to receive a voltage difference signal plus the at least one offset voltage signal, where the voltage difference signal is equal to the first feedback signal minus the second feedback signal; the non-inverting input node is arranged to receive the amplifier output signal; and the output node is arranged to output the detection result.

7. The transient boost controller of claim 4, wherein the comparator circuit has an inverting input node, a non-inverting input node, and an output node; the non-inverting input node is arranged to receive a voltage difference signal minus the at least one offset voltage signal, where the voltage difference signal is equal to the first feedback signal minus the second feedback signal; the inverting input node is arranged to receive the amplifier output signal; and the output node is arranged to output the detection result.

8. The transient boost controller of claim 3, wherein the processing circuit comprises:
    a plurality of transconductance amplifier circuits, arranged to generate a plurality of amplifier output signals according to at least the reference voltage signal, the at least one offset voltage signal, the first feedback signal, the second feedback signal, the time derivative of the first feedback signal, and the time derivative of the second feedback signal; and
    a current comparator circuit, arranged to receive the plurality of amplifier output signals output from the plurality of transconductance amplifier circuits, respectively, and output the detection result according to the plurality of amplifier output signals.

9. The transient boost controller of claim 8, wherein the plurality of transconductance amplifier circuits comprise:
    a first transconductance amplifier circuit, having a non-inverting input node arranged to receive the first feedback signal and an inverting input node arranged to receive the reference voltage signal;
    a second transconductance amplifier circuit, having a non-inverting input node arranged to receive a reference ground signal and an inverting input node arranged to receive the second feedback signal;
    a third transconductance amplifier circuit, having a non-inverting input node arranged to receive the time derivative of the first feedback signal and an inverting input node arranged to receive the time derivative of the second feedback signal; and
    a fourth transconductance amplifier circuit, having a non-inverting input node arranged to receive the at least one offset voltage signal and an inverting input node arranged to receive the reference ground signal.

10. The transient boost controller of claim 8, wherein the plurality of transconductance amplifier circuits comprise:
a first transconductance amplifier circuit, having a non-inverting input node arranged to receive the first feedback signal and an inverting input node arranged to receive the reference voltage signal;
a second transconductance amplifier circuit, having a non-inverting input node arranged to receive a reference ground signal and an inverting input node arranged to receive the second feedback signal;
a third transconductance amplifier circuit, having a non-inverting input node arranged to receive the time derivative of the first feedback signal and an inverting input node arranged to receive the time derivative of the second feedback signal; and
a fourth transconductance amplifier circuit, having a non-inverting input node arranged to receive the reference ground signal and an inverting input node arranged to receive the at least one offset voltage signal.

11. The transient boost controller of claim 1, wherein the voltage regulator is a multi-phase switching regulator having a master phase and at least one slave phase, and the processing circuit is further arranged to output the detection result for controlling the at least one slave phase of the multi-phase switching regulator.

12. A method for controlling a transient boost circuit of a voltage regulator, comprising:
obtaining a first feedback signal and a second feedback signal sensed from an output capacitor of the voltage regulator, wherein the first feedback signal is derived from a voltage signal at a first plate of the output capacitor, and the second feedback signal is derived from a voltage signal at a second plate of the output capacitor; and
generating a detection result according to the first feedback signal and the second feedback signal, and outputting the detection result for controlling the transient boost circuit of the voltage regulator.

13. The method of claim 12, wherein generating the detection result according to the first feedback signal and the second feedback signal comprises:
generating a time derivative of the first feedback signal and a time derivative of the second feedback signal; and
generating the detection result based at least partly on the time derivative of the first feedback signal and the time derivative of the second feedback signal.

14. The transient boost controller of claim 13, wherein generating the detection result based at least partly on the time derivative of the first feedback signal and the time derivative of the second feedback signal comprises:
receiving a reference voltage signal and at least one offset voltage signal; and
generating the detection result according to at least the reference voltage signal, the at least one offset voltage signal, the first feedback signal, the second feedback signal, the time derivative of the first feedback signal, and the time derivative of the second feedback signal.

15. The method of claim 14, wherein generating the detection result according to at least the reference voltage signal, the at least one offset voltage signal, the first feedback signal, the second feedback signal, the time derivative of the first feedback signal, and the time derivative of the second feedback signal comprises:
generating, by a differentiator amplifier circuit, an amplifier output signal according to at least the first feedback signal, the second feedback signal, and the reference voltage signal, wherein the amplifier output signal depends on at least the reference voltage signal, the time derivative of the first feedback signal, and the time derivative of the second feedback signal; and
generating, by a comparator circuit, the detection result according to the first feedback signal, the second feedback signal, the at least one offset voltage signal, and the amplifier output signal.

16. The method of claim 14, wherein generating the detection result according to at least the reference voltage signal, the at least one offset voltage signal, the first feedback signal, the second feedback signal, the time derivative of the first feedback signal, and the time derivative of the second feedback signal comprises:
generating, by a plurality of transconductance amplifier circuits, a plurality of amplifier output signals according to at least the reference voltage signal, the at least one offset voltage signal, the first feedback signal, the second feedback signal, the time derivative of the first feedback signal, and the time derivative of the second feedback signal; and
generating, by a current comparator circuit, the detection result according to the plurality of amplifier output signals that are output from the plurality of transconductance amplifier circuits, respectively.

17. The method of claim 12, wherein the voltage regulator is a multi-phase switching regulator having a master phase and at least one slave phase, and the method further comprises:
outputting the detection result for controlling the at least one salve phase of the multi-phase switching regulator.

* * * * *